United States Patent
Gill et al.

[11] Patent Number: 5,255,272
[45] Date of Patent: Oct. 19, 1993

[54] PREDICTIVE TAPE DRIVE ERROR CORRECTION APPARATUS

[75] Inventors: Richard A. Gill, Arvada; Christopher P. Zook, Boulder, both of Colo.

[73] Assignee: Storage Technology Corporation, Louisville, Colo.

[21] Appl. No.: 660,652

[22] Filed: Feb. 25, 1991

[51] Int. Cl.$^5$ .............................................. G06F 11/10
[52] U.S. Cl. .................................. 371/40.3; 371/40.1
[58] Field of Search ...................... 371/40.3, 40.1, 50.1

[56]  References Cited

U.S. PATENT DOCUMENTS

| | | | |
|---|---|---|---|
| Re. 28,923 | 8/1976 | Patel | 371/40.3 |
| Re. 30,187 | 1/1980 | Hong et al. | 371/40.3 |
| 3,745,528 | 4/1973 | Patel | 371/40.3 |
| 3,774,154 | 11/1973 | Devore et al. | 371/40.3 |
| 4,201,976 | 5/1980 | Patel | 371/50.1 |
| 4,205,324 | 5/1980 | Patel | 371/50.1 |
| 4,433,415 | 2/1984 | Kojima | 371/40.3 |
| 4,870,645 | 9/1989 | Herron | 371/37.4 |
| 4,884,274 | 11/1989 | Rather | 371/40.3 |

Primary Examiner—Charles E. Atkinson
Attorney, Agent, or Firm—Duft, Graziano & Forest

[57]  ABSTRACT

The error correction apparatus of this invention maintains a set of pointers which are used to supplement the error correction characters written into the data tracks of the data frame. These pointers consist of indicators stored in a memory that note the location and nature of errors detected in the present data frame or in previous data frames read from the magnetic tape and stored in a buffer memory. The pointer information can be used by the error correction circuitry to determine which tracks typically produce the errors in the data frame. The error correction circuitry can then generate error patterns which can be combined with the data read and reread from the buffer to correct the errors contained therein.

16 Claims, 4 Drawing Sheets

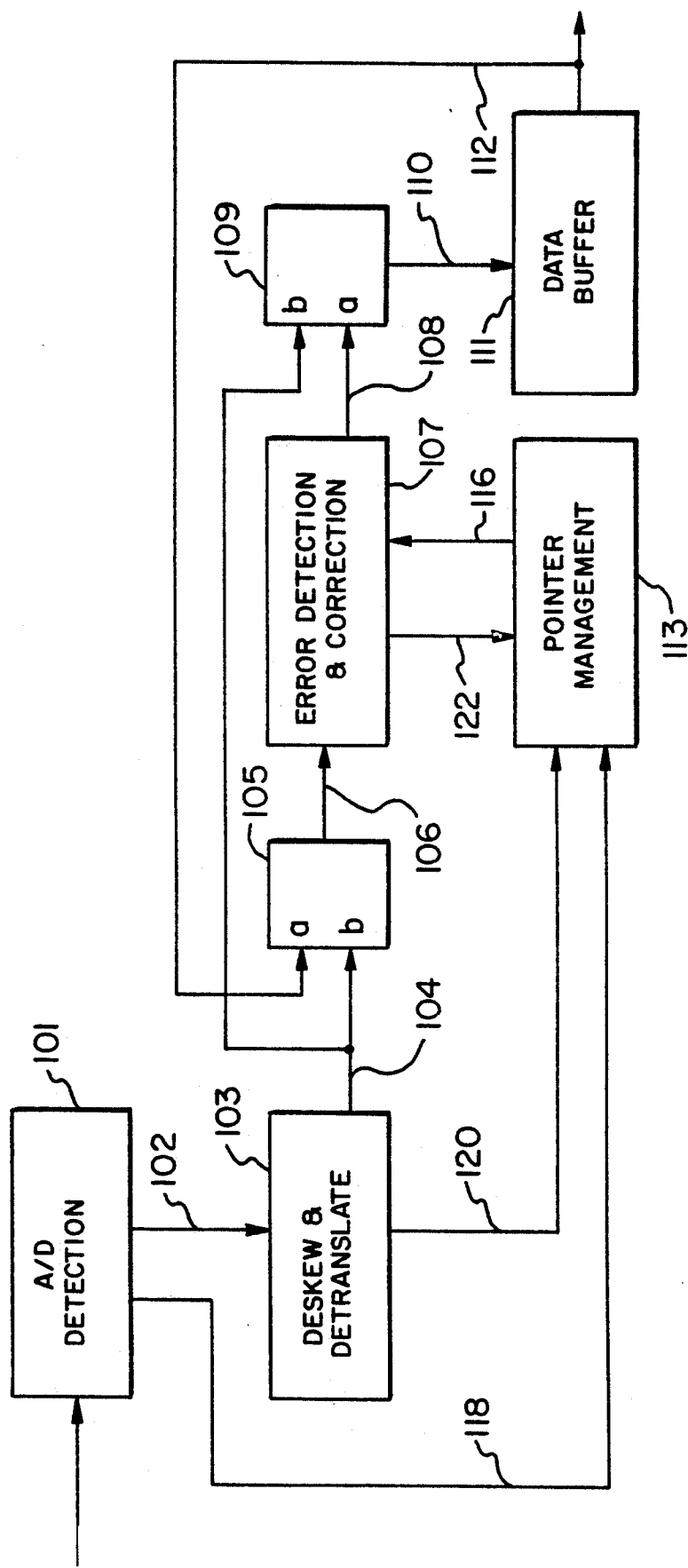
FIG. I.

| PHY TK | DATA-BYTE SEQUENCE | ECC DATA GROUP A | ECC DATA GROUP B | ENCODED BYTE |
|---|---|---|---|---|
| 1 | 1 | b b b b b b b b | b b b b b b b b | x x x x x x x x x |
| 2 | 2 | b b b b b b b b | b b b b b b b b | x x x x x x x x x |
| 3 | 3 | b b b b b b b b | b b b b b b b b | x x x x x x x x x |
| 4 | 4 | b b b b b b b b | b b b b b b b b | x x x x x x x x x |
| 5 | 5 | b b b b b b b b | b b b b b b b b | x x x x x x x x x |
| 6 | 6 | b b b b b b b b | b b b b b b b b | x x x x x x x x x |
| 7 | 7 | b b b b b b b b | b b b b b b b b | x x x x x x x x x |
| 8 | 8 | b b b b b b b b | b b b b b b b b | x x x x x x x x x |
| 9 | 9 | b b b b b b b b | b b b b b b b b | x x x x x x x x x |
| 10 | 10 | b b b b b b b b | b b b b b b b b | x x x x x x x x x |
| 11 | 11 | b b b b b b b b | b b b b b b b b | x x x x x x x x x |
| 12 | 12 | b b b b b b b b | b b b b b b b b | x x x x x x x x x |
| 13 | 13 | b b b b b b b b | b b b b b b b b | x x x x x x x x x |
| 14 | 14 | b b b b b b b b | b b b b b b b b | x x x x x x x x x |
| 15 |  | p p p p p p p p | p p p p p p p p | x x x x x x x x x |
| 16 |  | p p p p p p p p | p p p p p p p p | x x x x x x x x x |
| 17 |  |  | p p p p p p p p | x x x x x x x x x |
| 18 |  |  |  | x x x x x x x x |
| BIT POSITION IN THE BYTE |  | 8 7 6 5 4 3 2 1 | 8 7 6 5 4 3 2 1 | 9 8 7 6 5 4 3 2 1 |

FIG. 2.

b — DATA BIT
p — ECC BIT
x — 8/9 ENCODED BIT

PREDICTIVE TAPE DRIVE ERROR CORRECTION APPARATUS

FIELD OF THE INVENTION

This invention relates to data processing systems and, in particular, to error correction apparatus that detects and corrects errors in the data read from a magnetic medium such as a magnetic tape.

PROBLEM

It is a problem in data processing systems to detect and correct errors in data read from a storage medium in a timewise efficient manner. The typical error correction circuitry in a tape control unit receives a data frame read from a magnetic tape and attempts to correct the data on the fly using hardware generated error pointers as the data frame is being read from the magnetic tape. Such an arrangement can detect and correct simple errors found in the data frame read from the magnetic tape. When more complex or more numerous errors are found in the data frame read from the magnetic tape, and there are an insufficient or excessive number of error pointers, the errors contained in the data frame become uncorrectable. A common recovery procedure is for the tape control unit to reread the data frame from the magnetic tape a number of times in order to correct the errors contained in the read data. The data frame is reread in the expectation that marginal data will appear differently to the hardware on successive rereads and more accurate error pointers will therefore be produced to correct the errors contained in the data frame. Each data frame reread requires that the magnetic tape be stopped, repositioned and reread. This process is time consuming and in many cases, the data error correction circuitry is inadequate to correct all of the errors found in the data frame read from the magnetic tape in spite of data frame rereading.

The operation of this error correction circuitry is therefore time consuming and requires that the data frame be read several times from the magnetic tape in order to correct all of the errors contained therein. In many cases, the errors contained in the data frame cannot be corrected because there is insufficient error correction data in the data frame itself to correct all of the errors in the data frame as read from the magnetic tape.

SOLUTION

These problems are solved and a technical advance achieved in the field by the predictive tape drive error correction apparatus of the present invention. This apparatus supplements the standard error correction logic in order to improve the efficiency of the error correction logic and correct errors in the data frame read from the magnetic tape in a timewise efficient fashion. A data frame read from a magnetic tape consists of a plurality of tracks of data. In a typical magnetic tape system there are eighteen (18) tracks of data in each data frame. The data frame includes not only data but also error correction characters that are used to indicate the presence or absence of errors in the data for each of the tracks of data. A data frame is typically read from the magnetic tape during a read operation or a read after write operation which insures that the records written can be retrieved from the magnetic tape with sufficient accuracy. In both of these cases, the data frame is read from the magnetic tape and the eighteen (18) tracks of data are deskewed, error checked and then corrected if necessary.

The data frame read from the magnetic tape is stored in a buffer memory that can contain a number of data frames. Thus, the data frame read from the magnetic tape must be processed for error detection and correction in a timewise efficient manner since the tape drive reads additional data frames into the buffer memory while the error detection and correction operation is taking place. Simple errors in the data can be corrected by processing the data tracks through a standard error correction logic circuit and then outputting the corrected data directly without any additional processing. More complex or numerous errors in the data frame read from the magnetic tape may require a number of cycles of the error correction logic circuit in order to detect and correct all the errors that are located in a plurality of the data storage tracks of the data frame. In some cases, the error correction characters written into the data tracks are insufficient to identify both the location of the errors contained in the data frame as well as the nature of these errors. In such a case, the data read operation must be aborted and the data frames that are stored in the buffer memory reread from the magnetic tape in order to obtain a more accurate data frame read from the magnetic tape. If the reread operation is not successful in obtaining a more error free data frame from the magnetic tape, than the data cannot be read from the magnetic tape with any degree of accuracy.

The error correction apparatus of this invention maintains a set of pointers which are used to supplement the error correction characters written into the data tracks of the data frame. These pointers consist of indicators stored in a memory that note the location and nature of errors detected in the present data frame and in previous data frames read from the magnetic tape. These pointers indicate the presence of detected errors in the present data frame as well as the location of commonly occurring errors in the data read from the magnetic tape. The pointer information can be used by the error correction circuit to determine which tracks typically produce the errors in the data frame. The error correction circuit can then generate error patterns which can be combined with the data on the data tracks to correct the errors contained therein to produce a corrected data frame. These pointers supplement the error correction characters written into the data frame and improve the timewise efficiency of the error correction circuit as well as providing additional error correction data to correct heretofore uncorrectable data errors.

BRIEF DESCRIPTION OF THE DRAWING

FIG. 1 illustrates the predictive tape drive error correction apparatus in block diagram form;

FIG. 2 illustrates the format of a typical data frame;

DETAILED DESCRIPTION OF THE DRAWING

Figure 3:
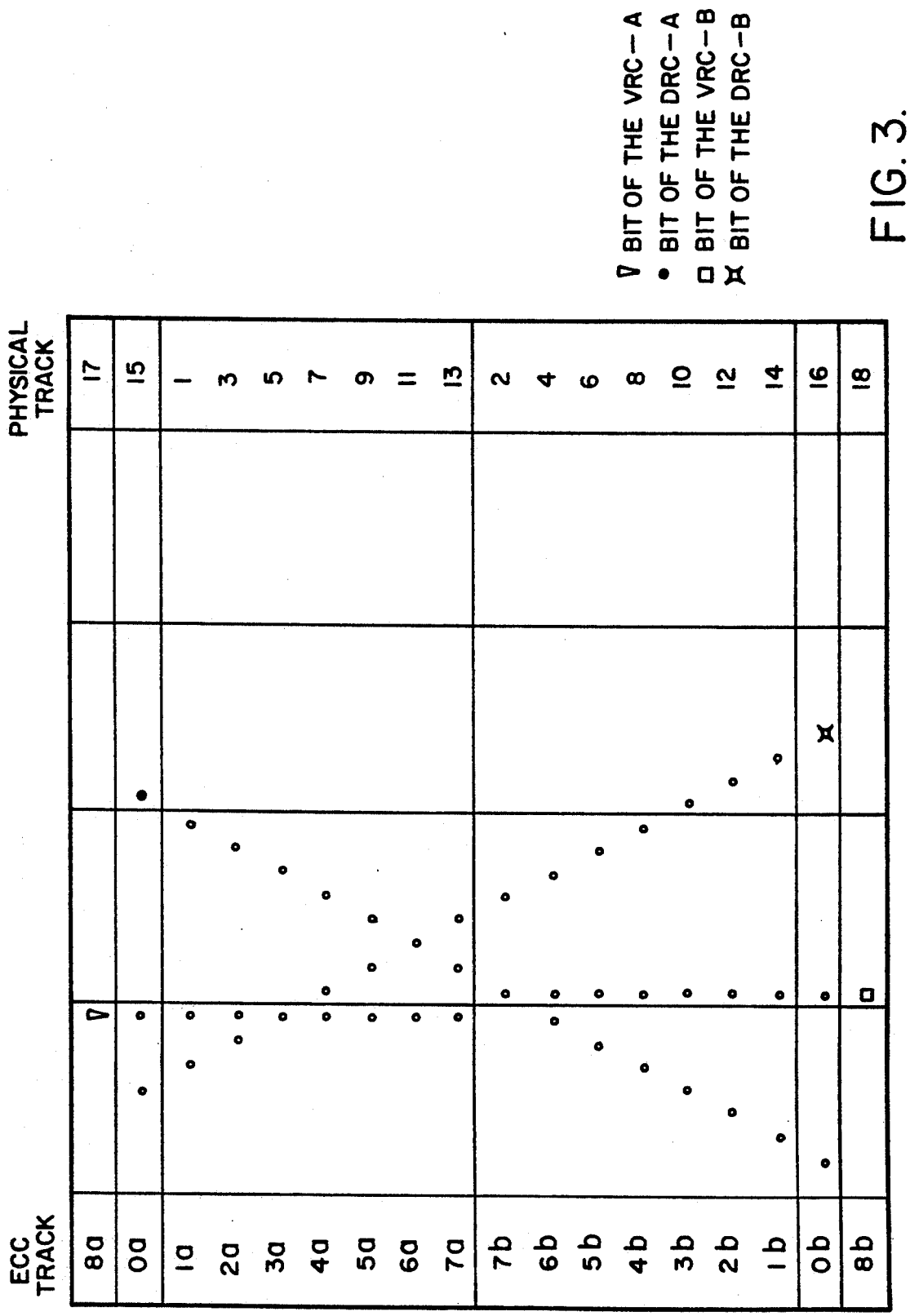
FIG. 3 illustrates the organization of the error correction characters.

The data contained in a data file is arranged in groups called data frames, each of which includes computed error correcting code bytes. The data bytes and the error correcting code bytes are all recorded on data tracks on a magnetic tape according to an 8/9 group code encoding scheme. The data frame itself is a logical section across all eighteen (18) tracks of the magnetic tape and contains logically related bytes. Each byte in a data frame is recorded along a track of the magnetic tape. The data frame contains fourteen (14) data bytes and four (4) bytes of error correcting code as illustrated in FIG. 2. The data bytes are placed in the data frame with the first seven (7) bytes of data written on the odd numbered tracks 1 to 13, while the second seven (7) bytes of data are written in the even numbered tracks 2 to 14 of the magnetic tape. The four (4) bytes of error correcting code are written in tracks 15 to 18.

Error Correcting Code

The error Correcting code presently used in tape drives yields two type of check bytes: diagonal redundancy check bytes, vertical redundancy check bytes. These two sets of redundancy check bytes are computed for each data frame received from the magnetic tape. Each data frame of eighteen (18) data tracks are grouped into two sets. Set A consists of the nine (9) odd numbered data tracks while Set B consists of the nine (9) even numbered data tracks. FIG. 3 illustrates a typical data frame containing eighteen (18) data tracks divided up into Sets A and B. The error correcting codes consisting of the diagonal and vertical redundancy check bytes are also illustrated in FIG. 3.

The diagonal redundancy check bytes are calculated on a different bit per data track, where the bits in successive tracks are sequentially numbered. For example, in the first track of Set A the first bit position is used in the calculation while in the next track of Set A, track 3, the second bit position is used in the calculation and so on for the remaining tracks in Set A. A similar operation is performed for Set B using the even numbered tracks. Results of the diagonal redundancy check byte calculations are written in track 0 of Sets A and B respectively. As can be seen from FIG. 3, the diagonal redundancy check consists of two calculations, one starting with the low numbered bits in the first track of Set A and ending in the highest numbered bit position of the last track of Set B while the second calculation is the opposite, starting with the lowest numbered bit in the last track of Set B and ending in the highest numbered bit of the first track of Set A. The calculation of the diagonal redundancy check error correcting code is given in the following two equations $$A0_m = (A1_{m-1} + A2_{m-2} + \ldots A7_{m-7} + B7_{m-8} + \ldots B0_{m-15}) \text{modulo } 2 \quad (1)$$

$$B0_m = (B1_{m-1} + B2_{m-2} + \ldots + B7_{m-7} + A7_{m-8} + \ldots A0_{m-15}) \text{modulo } 2 \quad (2)$$

The vertical redundancy check error correcting code is similar to the diagonal redundancy check error correcting code as illustrated in FIG. 3. The commonality is that the vertical redundancy check error correcting code also spans all the tracks in the data frame. The vertical redundancy check error correcting code spans all of the same numbered bit positions in all of the tracks of a particular set of the data frame. Thus, all of the identically numbered bit positions in all of the data tracks of Set A are used to calculate the vertical redundancy check bit for that bit position in Set A. An identical operation is performed for all of the tracks in Set B. The results of these calculations are recorded in track 8 of Sets A and B respectively. The computation of the vertical redundancy check error correcting code is given by the following two equations:

$$A8_m = (A0_m + A1_m + \ldots + A7_m) \text{modulo } 2 \quad (3)$$

$$B8_m = (B0_m + B1_m + \ldots + B7_m) \text{modulo } 2 \quad (4)$$

8/9 Group Code Encoding

The diagonal redundancy check and vertical redundancy check error correcting codes consist of eight (8) bit bytes. These eight (8) bit bytes along with the eight (8) bit data bytes are encoded into nine (9) bit bytes in accordance with the 8/9 group code encoding scheme data frame format used on magnetic tapes. FIG. 2 illustrates the correspondence between the physical tracks on the magnetic tape and the location of the data bytes and the error correcting code bytes thereon. The resultant eight (8) bit bytes in both Set A and B are converted by the 8/9 group code into the nine (9) bit encoded byte data shown in the right most column on FIG. 2. It is these nine (9) bit bytes that are written on the eighteen (18) tracks of the magnetic tape to comprise a data frame. It is obvious that from the use of four (4) sets of error correcting characters and their particular orientation, the error correcting circuit can locate the position of an error on a particular data track of the eighteen (18) tracks. Using the error correcting code information, the error correcting circuit can also revise the data written on this data track to compensate for the error located therein. However, when a plurality of errors occur in a particular data frame, locating and correcting these errors become more difficult.

Predictive Error Correction Apparatus

FIG. 1 illustrates in block diagram form the predictive tape drive error correction apparatus of the present invention which overcomes the limitations of prior error correction circuits.

Data read from the magnetic tape is input to A/D detection circuit 101 which generates a clock signal from the retrieved data and converts the received signal from the magnetic tape into a digital sequence of ones and zeros. The resultant digital data is output over lead 102 to deskew circuit 103. The deskew circuit 103 accumulates the data bytes read in from each of the eighteen (18) data tracks in the data frame. The data bytes read into the accumulator are nine (9) bit coded bytes written in an 8/9 group code encoding scheme. The eighteen (18) tracks of data are synchronized and checked to insure that all nine (9) bits of the encoded bytes have been received for each of the eighteen (18) data tracks. Once the complete data frame has been received and synchronized, the nine (9) bit encoded bytes are de-translated into the eight (8) bit bytes of data and error correcting code. The de-translated data frame is output over lead 104 through selector 105 to error detection and correction circuit 107. Selector 105 either inputs the detranslated data frame to the error detection and correction circuit 107 for a normal read operation or blocks the transmission of the de-translated data frame so that the data frame can be stored in data buffer 111 in the case where the data frame is being reread from the magnetic tape because of the detection of a significant number of errors.

Assume for the purpose of this description that the de-translated data frame is directly read into error detection and correction circuit 107 to analyze the data frame to detect errors in the data and identify the location of the tracks that contain the data errors. Error detection and correction circuit 107 also generates error patterns which can be combined with the uncorrected data frame to produce corrected data frames. The corrected data output by error detection and correction circuit 107 is switched by selector 109 to data buffer 111 where it is temporarily stored for outputting over lead 112 to the data processing circuitry connected to this apparatus. In the case where a significant number of errors is identified in the data frame as input from the magnetic tape, the data frame is reread from the magnetic tape. The reread data frame, instead of being applied to error detection and correction circuit 107 by selector 105, is applied over lead 104 through selector 109 to data buffer 111 where it is temporarily stored for error correction processing. This uncorrected data frame can then be fed into error detection and correction circuit 107 by way of lead 112 through selector 105.

The operation of error detection and correction circuit 107 is coupled with pointer management circuit 113 which stores indications of detected errors in the present data frame and frequently occurring errors in previously received data frames. Pointer management circuit 113 receives inputs from A/D detection circuit 101, deskew circuit 103 and error detection and correction circuit 107 to indicate the occurrence of an error in the present data frame. Pointer management circuit 113 also stores indicators in a register to note the occurrence of errors in previously received data frames. The combined set of presently detected and previously detected errors is output to error detection and correction circuit 107 on lead 116 to provide error detection and correction circuit 107 with additional error detection and correction information in order to generate error patterns which can be combined with the uncorrected data frame in order to produce a corrected data frame.

Error Detection and Correction Circuit

Figure 4:
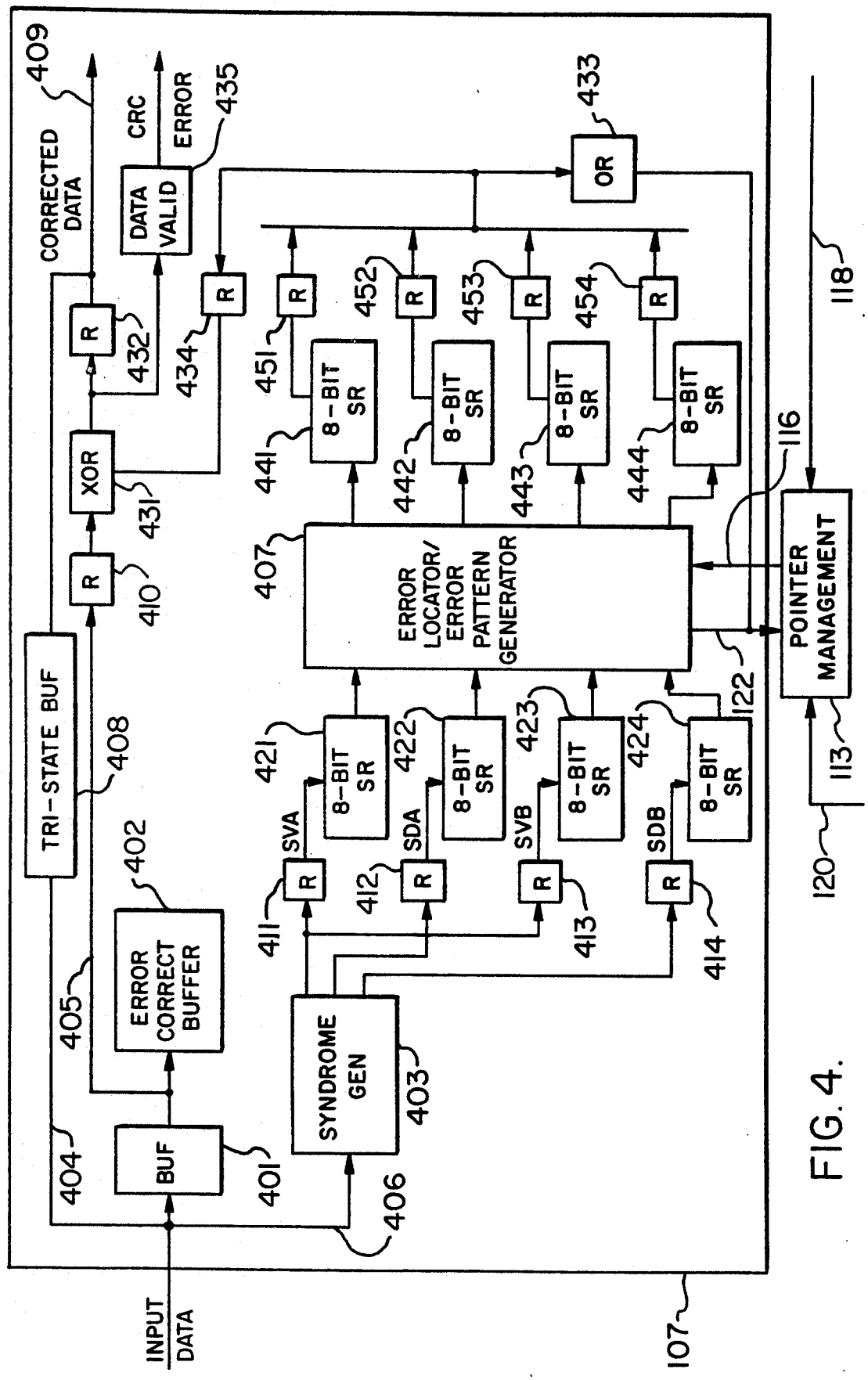
FIG. 4 illustrate additional details of the predictive tape drive error detection and correction apparatus.

FIG. 4 illustrates in block diagram form the structure of the error detection and correction circuit 107. Detranslated data frames output by deskew circuit 103 are stored in error correction buffer 402 by way of buffer 401. Error correction buffer 402 holds eight (8) data frames. A data frame received from deskew circuit 103 is written in error correction buffer 402 at the same time that it is being written over lead 406 into syndrome generator 403. Syndrome generator 403 processes all eighteen (18) data tracks that comprise one data frame and outputs four (4) syndrome bytes (SVA, SDA, SVB, SDB) during each correction cycle. The four (4) syndrome bytes are the vertical syndrome for Group A (SVA), the diagonal syndrome for Group A (SDA), the vertical syndrome for Group B (SVB), and the diagonal syndrome for Group B (SDB). These error correction codes were discussed above and are given by equations 1–4.

At the end of a correction cycle, the four eight bit syndrome bytes are loaded into corresponding shift registers 421–424. During the subsequent correction cycle, the syndrome bytes stored in shift registers 421–424 are output a bit at a time into error locator/error pattern generator 407. The error locator/error pattern generator 407 also receives input data from pointer management 113 which outputs data indicative of which of the eighteen (18) tracks require an error pattern generated for it in the subsequent correction cycle. Thus, error locator/error pattern generator 407 combines the data received from pointer management 113 and the syndrome bytes from shift registers 421–424 to generate error patterns indicative of the errors detected in the received data frame. The operation of error locator/error pattern generator 407 is described on a theoretical basis in the publication entitled "Adaptive Cross-Parity Code for a High Density Magnetic Tape Subsystem" as published in the IBM Journal of Research and Development, Volume 29, No. 6, in November 1985. The error patterns generated by error locator/error pattern generator 407 are output a bit at a time to shift registers 441–444. The data stored in shift registers 441–444 are combined with the uncorrected data stored in error correction buffer 402 by the use of exclusive OR circuit 431. Thus, the uncorrected data frame is read a byte at a time from error correction buffer 402 on lead 405 to exclusive OR circuit 431 along with appropriate error correction patterns from the ones of shift registers 441–444 that contain the corresponding correction information. Exclusive OR circuit 431 combines the error pattern with the uncorrected data byte to produce a corrected data byte which is output through buffer 432 onto lead 409. Thus, up to four (4) individual error patterns can be generated by error locator/error pattern generator 407 and stored in the corresponding ones of shift registers 441–444.

Pointer Management

The operation of error locator/error pattern generator 407 is enabled by the use of pointer management circuit 113 which stores indicators of detected errors in the present data frame and of errors detected in previously processed data frames. Pointer management circuit 113 receives data from error locator/error pattern generator 407 indicative of tracks found in error using the error correcting code by error locator/error pattern generator 407. Pointer management circuit 113 also receives data from deskew circuit 103 indicative of a bad track received by deskew circuit 103 or of an illegal nine (9) bit data byte received by deskew circuit 103. A/D detection circuit 101 also outputs data to pointer management circuit 113 indicative of any marginal conditions detected in the decoding of the data signal received from the magnetic tape. All of these data inputs are used by pointer management circuit 113 to store an indication of data errors found in the eighteen (18) data tracks of the data frame. A counter is allocated in pointer management 113 for each of eighteen (18) data tracks. The counter is incremented for each data frame in which the error pattern produced was non-zero. For each frame in which the error pattern is all zero, the counter is decremented for this data track. When the counter is below a certain predetermined threshold, no output bit is produced for this particular data track thereby indicating to error locator/error pattern generator 407 that there is no discernable pattern of data errors for this data track. When the count in the counter is above this predetermined threshold, pointer management 113 outputs a track in error bit to error locator/error pattern generator 407 indicative of either a data error detected in the present frame or a pattern of errors in previously received data frames for this particular data track.

Thus, pointer management circuit 113 provides predictive information to error locator/error pattern generator 407 to thereby better enable the detection and correction of errors in the present data frame. While the error correcting codes in the data frame can be used by error detection and correction circuit 107 to correct simple errors, more complex or more numerous errors are difficult to detect and correct without the predictive information provided by pointer management 113. Recurring errors in the reading of data from a magnetic tape are not noted in the error correcting codes of the data frame but would be noted by the track in error signals produced by pointer management circuit 113, thereby providing additional data for error locator/error pattern generator 407 to enable the circuit to more easily locate and correct any data errors in the eighteen (18) tracks of data received from the magnetic tape.

While a specific embodiment of the present invention have been described in detail herein, it is understood that various changes and modifications can be made without departing from the scope of the claims contained herein.

I claim:

1. A method of correcting errors in a data transmission that contains a plurality of sequential data frames, wherein each data frame consists of a plurality of tracks of data, comprising the steps of:
   storing said plurality of tracks of data in a memory for a presently received one of said plurality of data frames;
   generating pointers indicative of detected data errors in said presently received data frame;
   recording said generated pointers for each sequentially received data frame;
   generating error patterns indicative of said detected errors for said presently received data frame using said pointers for said presently received data frame and previously received ones of said data frames; and
   correcting said stored tracks of data in said presently received data frame using said generated error patterns.

2. The method of claim 1 wherein said step of correcting includes the step of:
   combining said generated error patterns with said stored tracks of data for said presently received data frame in an exclusive OR operation.

3. The method of claim 1 wherein said step of recording including the step of:
   skew detection of a bad track of data in said presently received data frame.

4. The method of claim 1 wherein said step of recording includes the step of:
   detecting illegal 9-bit data in the data frame format in said presently received data frame.

5. The method of claim 1 wherein said step of recording includes the step of:
   detecting non-sync bytes of data in said presently received data frame.

6. The method of claim 1 wherein said step of recording includes the step of:
   detecting non-zero bytes in format prefix groups of said presently received data frame.

7. The method of claim 1 wherein said step of recording includes the step of:
   writing an indication of a detected error into a memory location in a track-in-error memory corresponding to the one of said tracks of data in which said detected error occurred in said presently received data frame.

8. The method of claim 7 wherein said step of recording further includes the step of:
   reading said indications from all of said memory locations in said track-in-error memory corresponding to said tracks of data in said presently received data frame.

9. Apparatus for correcting errors in a data transmission that consists of a plurality of sequential data frames, wherein each data frame includes a plurality of data tracks, comprising:
   means for deskewing data tracks received from said data transmission;
   means for storing said deskewed data tracks in a memory for a presently received one of said plurality of data frames;
   means for generating pointers indicative of detected data errors in said presently received deskewed data frame;
   means for storing said generated pointers for each sequentially received data frame; and
   means for correcting said stored deskewed data tracks for said presently received deskewed data frame using said stored pointers.

10. The apparatus of claim 9 wherein said correcting means includes:
    means for generating an error pattern for said presently received deskewed data frame using said stored pointers for said presently received deskewed data frame and stored pointers for previously received ones of said data frames, indicative of said data transmission errors in each of said data tracks.

11. The apparatus of claim 10 wherein said correcting means further includes:
    means for combining said generated error patterns with said stored data tracks of said presently received deskewed data frame.

12. The apparatus of claim 11 wherein said correcting means further includes:
    means for storing said combined stored data tracks as corrected data for said presently received deskewed data frame.

13. The apparatus of claim 9 wherein said pointer storing means includes:
    means for detecting data transmission errors in each of said received data tracks of said presently received deskewed data frame.

14. The apparatus of claim 13 wherein said detecting means includes:
    vertical syndrome means for detecting parity errors across the same bit position in all of said data tracks of said presently received deskewed data frame.

15. The apparatus of claim 14 wherein said detecting means further includes:
    diagonal syndrome means for detecting parity errors across bit positions that differ in successive ones of all of said data tracks of said presently received deskewed data frame.

16. The apparatus of claim 15 wherein said detecting means further includes:
    means responsive to said vertical and diagonal syndrome means for generating pointers indicative of the ones of said data tracks in said presently received deskewed data frame that contain data transmission errors.

* * * * *